(12) United States Patent
Yanagi et al.

(10) Patent No.: US 6,514,776 B1
(45) Date of Patent: Feb. 4, 2003

(54) INSTRUMENT AND METHOD FOR MEASURING CONTAMINATION OF WAFER SURFACE

(76) Inventors: Kumiko Yanagi, 2612, Shinomiya Hiratsuka-shi, Kanagawa 254-0014 (JP); Harumi Shibata, 2612, Shinomiya Hiratsuka-shi, Kanagawa 254-0014 (JP); Kiyoshi Nagai, 2612, Shinomiya Hiratsuka-shi, Kanagawa 254-0014 (JP)

( * ) Notice: Subject to any disclaimer, the term of this patent is extended or adjusted under 35 U.S.C. 154(b) by 0 days.

(21) Appl. No.: 09/599,205

(22) Filed: Jun. 22, 2000

(30) Foreign Application Priority Data

Jun. 24, 1999 (JP) .......................................... 11-178038
Feb. 17, 2000 (JP) ....................................... 2000-040010

(51) Int. Cl.[7] .......................... H01L 21/66; H01L 33/00
(52) U.S. Cl. ........................................ 438/14; 73/53.01
(58) Field of Search .............................. 438/14, 15, 16, 438/471, 476, 477; 324/765; 73/53.01, 60.11; 250/492.1, 492.2

(56) References Cited

U.S. PATENT DOCUMENTS

| | | | | |
|---|---|---|---|---|
| 4,028,135 A | * | 6/1977 | Vig et al. ...................... | 134/1 |
| 5,271,798 A | * | 12/1993 | Sandhu et al. ............... | 438/745 |
| 5,324,410 A | | 6/1994 | Kummer et al. | |
| 5,531,857 A | * | 7/1996 | Engelsberg et al. .......... | 156/345 |
| 5,814,156 A | * | 9/1998 | Elliot et al. .................... | 134/1 |
| 6,170,235 B1 | * | 1/2001 | Cho et al. ...................... | 53/428 |

FOREIGN PATENT DOCUMENTS

EP    0 339 463 A2  *  11/1989

* cited by examiner

*Primary Examiner*—Michael Sherry
*Assistant Examiner*—Evan Pert
(74) *Attorney, Agent, or Firm*—Welsh & Katz, Ltd.

(57) ABSTRACT

There is described an instrument capable of immediately and accurately extracting contaminants from solely either side of a wafer surface or from a certain area on the wafer surface. O-rings, each of which is partially cut, are attached to respective sides of wafer holding members. A wafer is held from respective sides by the wafer holding members. Extraction of contaminants from the upper surface of the wafer is carried out independently of extraction of contaminants from the underside of the wafer, by means of feeding extraction solvent to the interior spaces defined by the respective O-rings. Thereby, quick and appropriate extraction of contaminants from either side of a wafer.

23 Claims, 4 Drawing Sheets

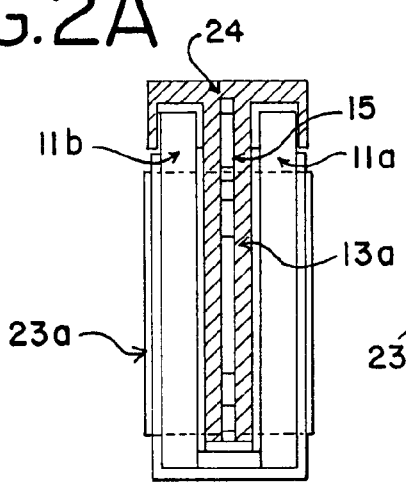
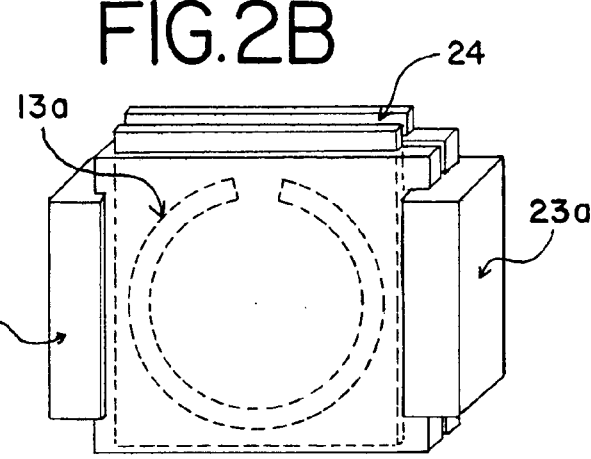
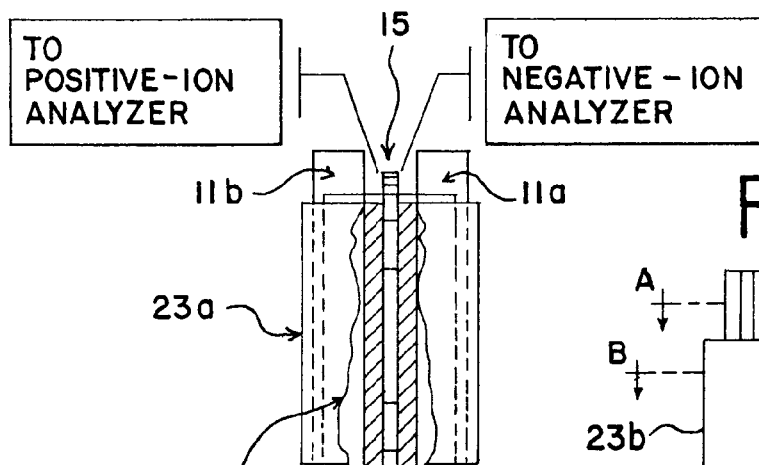
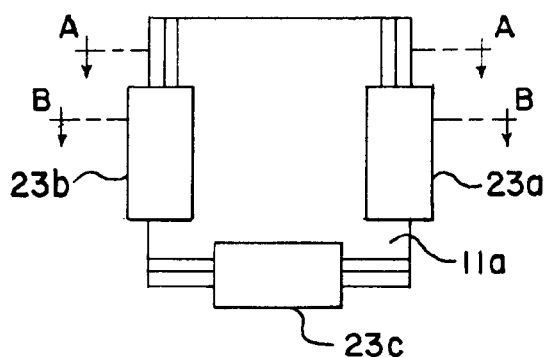
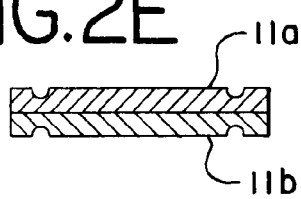
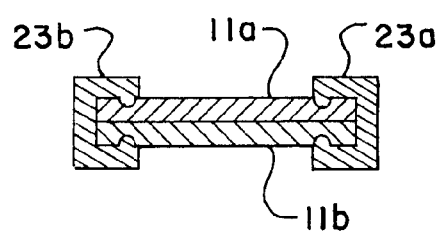

INSTRUMENT AND METHOD FOR MEASURING CONTAMINATION OF WAFER SURFACE

BACKGROUND OF THE INVENTION

1. Field of the Invention

The present invention relates to an instrument used for detecting contamination of the surface of a semiconductor wafer and to technology associated therewith, and more particularly, to an instrument suitable for detecting contaminants adhering to a wafer surface by means of the water-extracting technique.

2. Background Art

Contaminants adhering to a wafer surface are responsible for deterioration of the yield, performance, and reliability of a semiconductor device. Processes for manufacturing a semiconductor device include a number of cleaning steps. In spite of those cleaning steps, a wafer surface may be contaminated with particles, metal, various ions, or organic substances. In the event of a wafer surface being contaminated, immediate investigation of the source and cause of contamination is required for maintaining a high degree of cleanliness of semiconductor manufacturing processes. The importance of high-degree cleanliness grows increasingly in association with an increase in the density and integration of a semiconductor device.

Contamination of a wafer surface is usually determined by means of extracting. contaminants adhering to a wafer surface, through use of a specifically-designed solvent. The thus-extracted solution is subjected to qualitative/quantitative analysis by use of an analyzer [for example, ICP-MS (High-Frequency Inductively-Coupled Plasma Mass Analyzing System)].

According to the conventional technique for extracting contaminants to be delivered to analyzing processes, a wafer is put in a film pack for extracting a hot-water bag, and pure water is poured into the film pack. The wafer is left in its present form in a thermostatic chamber while being immersed in pure water within the film pack, to thereby extract the contaminants adhering to the wafer surface.

In the course of processes for manufacturing a semiconductor device, handling of an upper surface (a mirror-surface side) of a wafer completely differs from handling of an underside surface of the wafer. Further, the required cleanliness of an upper surface also greatly differs from that of an underside surface. Naturally, the state of contamination of the upper surface of the wafer greatly differs from that of the underside of the same. For this reason, contamination of the upper surface and contamination of the underside are preferably determined on an individual basis. The conventional extraction method involves a chance of the substances (contaminants) extracted from the upper surface and the substances extracted from the underside being mixed during the course of extraction processes, with the result that determination of contamination of solely the upper surface of a wafer has been infeasible.

To enable determination of contamination of a single side of a wafer, there, is used an extraction system which can extract contaminants from a respective side of a wafer by means of adding pure water to the surface of the wafer situated horizontally and vibrating the wafer. Although the extraction system enables extraction of contaminants from a single side of a wafer, the system can extract contaminants from solely either side of the wafer by way of a single determination operation. In a case where contamination of either side, of a wafer is desired to be determined, there must be prepared two wafers; i.e., one to be used for extracting contaminants from the upper surface of a wafer, and the other one to be used for extracting contaminants from the underside of the wafer.

Further, contaminants cannot be accurately determined unless contaminants are removed from the extraction system. For this reason, the extraction system must be cleaned every extraction operation. Thus, extraction of contaminants from either side of a wafer through use of such a extraction system involves consumption of much time and labor.

In association with a recent tendency toward an increase in the diameter of a wafer, predetermined areas on the same side of a wafer must be controlled in manners which differ from area to area. therefore, demand exists for not only attaining uniform cleanliness of solely either side of a wafer but also for attaining different degrees of cleanliness in a plurality of respective areas on the same surface. Increasing demand exists for a necessity for measuring contamination of a single surface as well as contamination of limited areas within a single surface. Any of the foregoing methods encounters difficulty in measuring contamination of limited areas on a wafer surface.

The present invention has been conceived in consideration of the above-described drawback of the background art and is aimed at providing an instrument capable of immediately and accurately extracting contaminants from solely either side of a wafer surface or from a certain area on the wafer surface.

SUMMARY OF THE INVENTION

As a result of considerable studies conducted by the inventors in order to solve the above-described drawback of the background art, the inventors have conceived an instrument suitable for independently and simultaneously measuring contaminants from the upper surface and underside of a wafer to be inspected, by means of enclosing certain areas on the upper surface and underside of the wafer independently, and feeding extraction solvent to the thus-enclosed areas independently. Thus, the inventors have completed the present invention.

To this end, a wafer to be inspected is held in a disposable film pack, and extraction solvent is fed into and drawn from the film pack, thereby eliminating a necessity for cleaning the extraction instrument every measurement operation. As a result, the clean state of the extraction instrument can be maintained, and an extraction operation can be made simple.

The instrument for measuring contamination of a wafer surface embodying the aforementioned idea is essentially materialized as follows:

(1) An instrument to be used for extracting contaminants from a wafer surface to be inspected, comprising:

a pair of wafer holding members which are provided opposite each other and hold the wafer from respective sides;

a curved protruding member provided on a surface of at least one of the wafer holding members, the surface being faced with the wafer, so as to cover a certain portion of the wafer surface while ensuring a predetermined entrance space; and solvent to be used for extraction being reserved in a space formed between the wafer holding member and the wafer as a result of presence of the curved protruding member.

(2) Preferably, a support member for supporting the lower edge of the wafer to be inspected is provided on a lower portion of the wafer holding member, to thereby position the wafer.

(3) Preferably, the curved protruding member is a cord-like member.

(4) Preferably, the curve of the curved protruding member assumes a circular geometry.

(5) Preferably, an instrument set for measuring contamination of a wafer comprises the instrument for measuring contamination of a wafer surface, and a disposable bag for holding the wafer. The wafer held in the bag is held from both side thereof.

(6) Preferably, a portion of the disposable bag to be enclosed by the curved protruding member and a portion of the same corresponding to the predetermined entrances bulge particularly.

In a case where such a bag is used, storage of solvent to be used for extracting contaminants becomes comparatively easy. Therefore, a disposable bag is suitable for measurement.

The present invention further includes the following method derived by generalization of use of the instrument according to the present invention.

(7) The present invention provides a method of measuring contaminants adhering to a wafer surface through extraction, the method comprising the steps of:

enclosing a certain area on the upper surface of a wafer to be inspected independently of another certain area on the underside of the wafer; and feeding and drawing extraction solvent to and from each of the enclosed areas independently, to thereby enable simultaneous and independent measurement of contaminants on the upper surface and underside of the wafer.

Simultaneous and independent extraction of contaminants on the upper surface and underside of a wafer is implemented for the first time by the present invention. Accordingly, the following method utilizing the foregoing method should be conceived as an invention significant to semiconductor manufacturing processes.

(8) The present invention also provides a method of manufacturing a semiconductor device, utilizing an inspection step in which extraction of contaminants adhering to the upper surface of a wafer and extraction of contaminants adhering to the underside of the wafer are carried out simultaneously and independently.

The expression "utilizing" is a broad concept including not only a case where the inspection step is incorporated into a round of processes for manufacturing a semiconductor device but also a case where the inspection step is used during the course of a series of processes for manufacturing a semiconductor device.

More specifically, the following instrument for measuring contamination of a wafer surface corresponds to the instrument according to the present invention.

(9) An instrument to be used for extracting contaminants from the surface of a wafer to be inspected, comprising:

a pair of wafer holding members capable of holding a wafer held in an impermeable bag;

fixing members for fixing the paired holding members while the holding members are brought opposite each other; and a surrounding member provided on a surface of at least one of the wafer holding members, the surface being faced with the wafer, so as to enclose a certain area on the surface of the wafer.

(10) Preferably, a support member for supporting the lower edge of the wafer to be inspected is provided on a lower portion of at least one of the wafer holding members, to thereby position the wafer.

(11) Preferably, the surrounding member is a cord-like member.

(12) Preferably, the surrounding member is a curved protruding member having an entrance.

(13) Preferably, the curved of the curved protruding member assumes a circular geometry.

(14) Preferably, an instrument set for measuring contamination of a wafer comprises the instrument for measuring contamination of a wafer surface, and an impermeable bag for holding the wafer. The wafer held in the bag is held from one side thereof.

(15) Preferably, a portion of the impermeable bag to be enclosed by the curved protruding member and a portion of the same corresponding to the predetermined entrances bulge particularly.

The present invention further includes the following method derived by generalization of use of the instrument according to the present invention.

(16) The present invention provides a method of measuring contaminants adhering to a wafer surface through extraction, the method comprising the steps of:

holding a wafer to be inspected into an impermeable bag;

enclosing a certain area on the upper surface of the wafer independently of another certain area on the underside of the wafer; and feeding and drawing extraction solvent to and from each of the enclosed areas independently, to thereby enable simultaneous and independent measurement of contaminants on the upper surface and underside of the wafer.

(17) The present invention also provides a method of manufacturing a semiconductor device, utilizing an inspection step in which extraction of contaminants adhering to the upper surface of a wafer to be inspected held in an impermeable bag and extraction of contaminants adhering to the underside of the wafer are carried out simultaneously and independently.

(18) The present invention also provides a method of measuring contaminants adhering to a wafer surface through extraction, the method comprising the steps of:

holding a wafer to be inspected in an impermeable bag;

enclosing a certain area on the surface of the wafer; and feeding and drawing extraction solvent to and from the inside or outside of the enclosed area, to thereby measure the distribution of contaminants on the wafer surface.

(19) The present invention also provides a method of manufacturing a semiconductor device, utilizing an inspection step in which contaminants are extracted from a certain area on the surface of a wafer, the wafer being an object of inspection and held in an impermeable bag, to thereby enable determination of contaminants in a certain range of the wafer surface.

(20) Preferably, the pair of holding members are identical in shape, each assuming a rectangular parallelepiped geometry. Further, the fixing members are preferably clamping members for clamping the pair of holding members in a paired manner. The clamping members fix three sides of the paired rectangular-parallelepiped holding members.

(21) Preferably, the clamping members are fitted around the paired rectangular-parallelepiped holding members in a sliding manner.

Preferably, a groove for guiding a slide of the clamping members is formed in each of the paired rectangular-parallelepiped holding members.

(22) Preferably, the fixing members are formed from a pair of magnets which are respectively provided on the paired holding members and attract each other. The paired holding members are fixed on the surface of the wafer under the attraction force of the magnets.

In order to enable measurement of contaminants without fail, the present invention provides features such as those provided below.

(23) Preferably, the method of measuring contamination of a wafer surface and the method of manufacturing a semiconductor device, which are set forth each comprise a step of exposing the wafer surface to UV radiation. As a result of exposure of a wafer surface to UV radiation, inorganic atoms (such as chlorine atoms, sulfur atoms, or like atoms) and inorganic atom groups (sulfur groups, nitrate groups, or like atomic groups) are dissociated in the form of ions (for example, $F^-$, $Cl^-$, $S^{2-}$, $SO_4^{2-}$, $NO_3^-$, $PO_4^{3-}$). Measurement of contaminants can be carried out without fail by means of extraction of such dissociated ions.

A wafer is usually exposed to UV radiation before measurement of contaminants on the surface of the wafer. However, during the course of measurement of contaminants of the wafer surface, the wafer is taken out and exposed to UV radiation, as required. Subsequently, the wafer may again be subjected to measurement of contaminants.

Preferably, a wafer can be exposed to UV radiation through use of ordinary UV radiation means, such as a UV lamp to which a mercury lamp is applied.

(24) Preferably, any one of the instrument sets set forth includes use of a quartz Petri dish for holding a wafer. A quartz Petri dish can be formed from the same material as that of a quartz cell to be used for measuring; for example, one exhibiting a ultraviolet absorption spectrum. Use of such a material can avoid a problem of the intensity of UV radiation being weakened by absorption of excessive absorption of UV radiation by a container or a problem of a measurement result being adversely affected by decomposition of a container through UV radiation.

(25) Preferably, the instrument employs a wafer having exposed to UV radiation as a wafer to be inspected. More specifically, any of the instruments set forth may use a wafer which has been exposed to UV radiation. As a result, ions, such as $Cl^-$ or $NO_3^-$, dissociated from organic substances through UV radiation are detected, to thereby enable more accurate measurement of inorganic substances.

Measurement of contaminants which is performed without fail through UV radiation can be generalized as follows:

(26) A method of measuring contaminants by extraction of contaminants adhering to the surface of a wafer to be inspected, the method including a step of irradiating the surface of the wafer with an electromagnetic wave of predetermined wavelength responsive to the characteristics of the contaminants. The expression "electromagnetic wave" means UV radiation, electrons, or another suitable electromagnetic wave, according to the type of a substance presumed to be a contaminant.

[Definitions of Expressions]

A wafer to be inspected includes not only a silicon wafer but also all wafers, such as wafers of compound semiconductors, which can be used as a substrate of an electronic component, such as a CPU or memory. In the specification, either side of a wafer is referred to as a "surface." In the case of a wafer whose one side is mirror polished, the mirror-polished surface of the wafer is referred to as an "upper surface," and the other surface of the wafer is referred to as an "underside." In the case of a wafer whose both sides are mirror polished, the surface of the wafer particularly desired to be inspected (in general, the surface of the wafer which is subjected to wafer processing such as thin-film formation and etching and is to be subjected to more accurate mirror polishing than the other surface) is referred to as an "upper surface." Further, the expression "contaminant" refers to a substance which is to be detected as a result of extraction. The expression "surface" used in connection with extraction signifies an area which may contain extractable contaminants.

The holding members employed in the present invention may be formed from a naturally-occurring substance such as metal or wood or an artificial substance such as a chemical substance, so long as the holding members possess sufficient rigidity so as to prevent leakage of extraction solvent, which would otherwise be caused when the holding members are deformed as a result of external force being applied to the holding members in order to maintain the holding members in an opposing state. From the viewpoint of ease of processing, a plastic member, such as polyacetal, acrylic resin, polyethylene terephthalate, or polypropylene, is desirable.

The "stopping members" used in the present invention signify members capable of fixing the pair of holding members in an opposing state. As an example, there may be employed a stopper for enclosing the outer periphery of the holding members, a member having a structure for fixing the holding members through use of screws, or a member for fixing the holding members by way of a wafer as a result of attraction of magnets provided on the respective holding members.

The expression "enclosing a certain area on the wafer surface" signifies that a predetermined area on a wafer surface desired to be measured or a predetermined area on a wafer surface desired to be excluded from objects of measurement is enclosed. The position and range of a certain area can be determined in correspondence with a predetermined area on the wafer surface requiring measurement. Further, the expression "certain area" signifies a certain area on a wafer surface isolated from the other area, regardless of whether the certain area is on the upper surface or underside of the wafer. For instance, "certain area" corresponds to the center, edge, or a portion of the center of a wafer surface.

The expression "curved" signifies a geometry comprising an entrance and a portion which is continued from the entrance and becomes wider as it departs from the entrance. Any geometry may be employed, so long as the geometry satisfies the requirements set forth. For instance, there may be employed a figure having a curved interior (having no angular portions) or a rectangular interior (angular interior), when viewed from above.

The "protruding member" may be provided on either of the paired wafer holding members or each of the paired wafer holding members. In a case where a protruding member is provided on each of the paired wafer holding members, contamination of the upper surface and underside of a wafer can be measured simultaneously. If a wafer to be inspected is sandwiched between the paired wafer holding members, the protruding members are preferably positioned so as to pair with and oppose each other. The paired "protruding members" may be slightly offset within a range in which the wafer is not damaged or fractured.

The protruding members may preferably be formed from chemically inactive rubber material or plastic material; for example, polytetrafluoroethylene. The protruding member may be formed into a predetermined contour, by means of hollowing planar material. In a case where the protruding member assumes a rope shape or a circumferential shape, an O-ring may be employed. For example, in a case where the protruding member is formed into a curved shape, the curved protruding member may be formed by means of hollowing a portion of planar material. In addition, in a case where the curved protruding member assumes a rope shape or a circular shape, there may be employed a member which is formed by cutting or breaking a portion of an O-ring, to thereby form an entrance. Further, the wafer holding member may be formed from a material different from that of the curved protruding member, or the wafer holding member and the curved protruding member may be formed from the same material. Moreover, the wafer holding member and the curved protruding member may be formed integrally.

The surface of the protruding member, which surface is to be brought into contact with a wafer, must be sufficiently smooth. The surface is required to exhibit smoothness such that solvent does not leak from a contact area when the protruding member is brought into pressing contact with a wafer at a predetermined pressure.

Measurement of contaminants includes qualitative measurement (i.e., the type's of detected ions) and quantitative measurement (i.e., the concentration of detected contaminants).

Preferably, according to the present invention, a plurality of instruments are stacked, to thereby enable simultaneous measurement of a plurality of wafers. Preferably, under surfaces of two wafers (or upper surfaces of two wafers in some cases) are brought into contact, to thereby enable simultaneous measurement of two upper surfaces (or two undersides in some cases).

The impermeable bag used with the instrument corresponds to a bag which permits permeation of extraction solvent to be fed into the bag. A person skilled in the art may select any bag in accordance with the property of solvent to be fed into the bag, as required. For instance, a commercially-available polyvinyl bag may be employed. In a case where a disposable bag is used, a step of cleaning the instrument can be simplified.

A bulging portion may be formed by a method commonly used for molding of resin, such as a blowing. In a case where the curved protruding member assumes a rope shape or a circumferential shape (i.e., a shape corresponding to an O-ring whose portion is cut or broken for an entrance), a bulging portion is formed into a square-and-circle shape.

Usually, ultrapure hot water is used as solvent to be used for extracting contaminants. Solvent of 30 ml or thereabouts is used in accordance with the capacity of an existing measurement apparatus. In a case where ultrapure hot water is used as solvent, halide ions (fluoride ions, chloride ions, or like ions), pseudohalide ions (nitrate ions, sulfate ions, or like ions), or other negative ions (phosphate ions or like ions) can be detected. Further, a predetermined organic solvent corresponding to a contaminant desired to be detected may be employed as a solvent.

BRIEF DESCRIPTION OF THE DRAWINGS

FIGS. 2A to 2F are schematic representations showing the user of the instrument according to the present invention;

DESCRIPTION OF THE PREFERRED EMBODIMENT

[Basic Configuration of an Instrument]

FIGS. 1A through 1F are schematic representations showing the basic configuration of an instrument for measuring contamination of a wafer surface according to the present invention (hereinafter referred to simply as an "instrument"). FIGS. 2A to 2F are schematic representations for describing use of the instrument. FIG. 2E is a cross-sectional view taken along line A—A shown in FIG. 2D, and FIG. 2F is a cross-sectional view taken along line B—B shown in FIG. 2D.

Figure 1A:
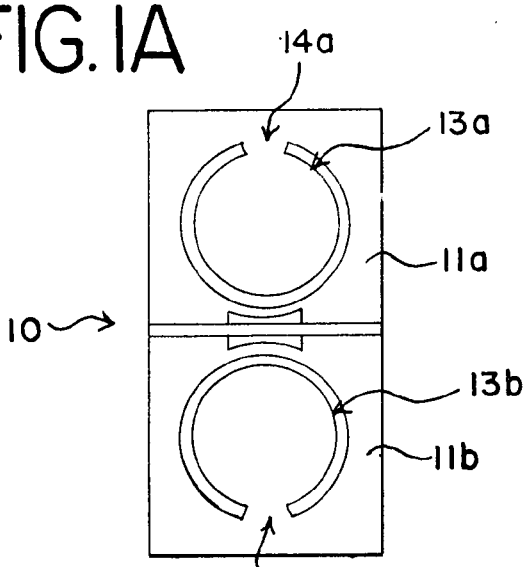
FIGS. 1A to 1F are schematic representations showing the basic configuration of an instrument for measuring contamination of a wafer surface according to the present invention.
Figure 1B:
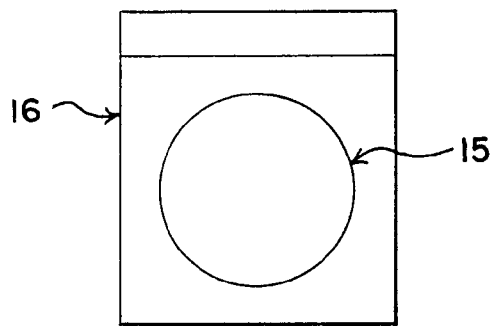

As shown in FIG. 1A, an instrument 10 for measuring contamination of a wafer surface comprises a pair of wafer holding members 11a and 11b which oppose each other and pinch a wafer to be inspected from either side thereof. Surrounding members (O-rings 13a and 13b are employed in the present embodiment as examples), each of which is partially cut, are attached to respective sides of the wafer holding members 11a and 11b, which sides are to come into contact with a wafer. The cuts of the respective O-rings 13a and 13b constitute entrances 14a and 14b, respectively.

A wafer 15 which is an object of inspection is held in a film pack 16. The wafer 15 held in the film pack 16 is sandwiched in its present form between the pair of wafer holding members 11a and 11b.

[Specifications and Operation of an Instrument]

When the wafer 15 is sandwiched between the wafer holding members 11a and 11b, the O-rings 13a and 13b come into contact with the wafer 15 by way of the film pack 16, wherewith the areas enclosed by the O-rings 13a and 13b become sealed.

Accordingly, when a fluid is supplied to the inside of the O-rings 13a and 13b, the fluid does not leak out of the inside area of the O-rings 13a and 13b and is reserved therein. In a case where a solvent for extracting contaminants is supplied to the inside area of the O-rings 13a and 13b, the solvent stays in only a predetermined area of the wafer 15 surrounded by the O-rings 13a and 13b, whereupon contaminants are extracted from only the predetermined area.

Extraction of contaminants from only the predetermined area of the wafer 15 surrounded by the O-rings 13a and 13b is performed in such a manner that extraction of contaminants from the upper surface is performed independently of extraction of contaminants from the underside of the wafer 15. In a case where the instrument according to the present invention is used, an extracted solvent can be obtained separately from the upper surface and underside of the wafer 15, thereby enabling independent determination of contamination of the upper surface and underside of the wafer 15. As will be described later, contaminants can be extracted simultaneously from the upper surface and underside of the wafer. Thus, the instrument according to the present invention can determine contamination of the upper surface and underside of the wafer independently of each other or simultaneously.

[Positioning of a Wafer]

Figure 1C:
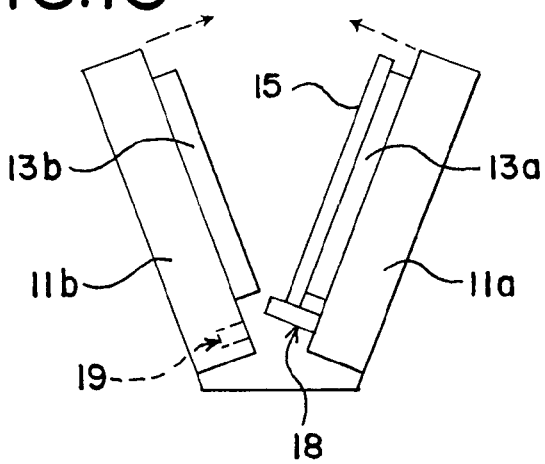

In order to enable appropriate extraction of contaminants from the wafer 15 and acquire reliable contamination data, the wafer 15 to be sandwiched between the wafer holding members 11a and 11b must be placed at a fixed position. As shown in FIG. 1C, in the instrument 10 according to the present invention, a support member 18 for supporting the lower end of the wafer 15 is formed in a lower portion of the wafer holding member 11a. The support member 18 is set so as to project inwardly beyond the O-ring 13a. When the wafer holding members 11a and 11b are disposed opposite each other, the tip end of the support member 18 is to be accommodated into a receiving hole 19 formed in the wafer holding member 11b. The support member 18 defines the position of the lowermost end of the wafer 15 to be sandwiched between the wafer holding members 11a and 11b. Therefore, the wafer 15 which is an object of inspection is positioned appropriately.

[Specifications of Variations]

Figure 1D:
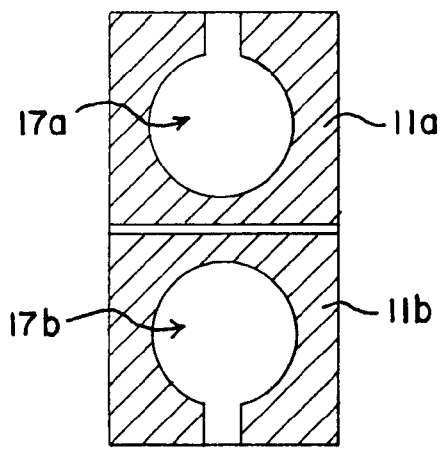

In a case where only a single surface of the wafer 15, for example, only the upper surface of the wafer 15, is desired to be inspected, only one O-ring may be provided, on either of the wafer holding members 11a and 11b. In place of the partially-cut O-rings 13a and 13b provided on the surfaces of the wafer holding members 11a and 11b, which surfaces come into contact with the wafer 15, square-and-circle-shaped recesses 17a and 17b may be formed respectively in the wafer holding members 11a and 11b, as shown in FIG. 1D. The square-and-circle-shaped recesses 17a and 17b may be formed such that the interior walls of the recesses 17a and 17b constitute square-and-circle-shaped curved protruding members. In this case, extracted solvent is reserved inside the recesses 17a and 17b, as in the case where extracted solvent is reserved inside the O-rings 13a and 13b.

[Film Pack]

An existing film pack used for subjecting a wafer to be inspected to hot-water extraction (i.e., an existing film pack for extracting contaminants from the upper surface and underside of a wafer simultaneously, which ordinarily does not enable extraction of contaminants from only a single side of a wafer) can be used as the film pack 16. In a case where the film pack 16 is used as in the case of the embodiment, the only requirement is that the film pack 16 be replaced with a new pack upon every inspection, thereby essentially eliminating a necessity of cleaning the wafer holding members 11a and 11b. Alternatively, if the wafer 15 is sandwiched directly between the wafer holding members 11a and 11b without use of the film pack 16, the wafer holding members 11a and 11b must be cleansed after every inspection. Either of the two methods is selected in comprehensive consideration of costs incurred by replacement of film packs 16 and costs incurred by cleaning the wafer holding members 11a and 11b.

Figure 1E:
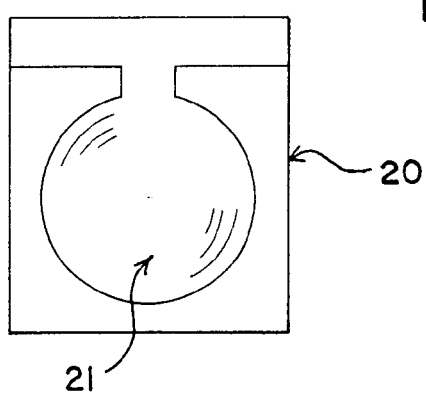
Figure 1F:

With regard to a film pack to be used with the instrument for determining contamination of a wafer surface according to the present invention, use of a film pack 20 shown in FIGS. 1E and 1F is more preferable than use of a flat bag (FIG. 1B) such as the film pack 16 (here FIG. 1F is a transverse cross-section of FIG. 1E) The film pack 20 is provided with a bulging section 21 fitted to the interior space defined by the O-rings 13a and 13b such that extracted solvent is easily reserved within the space defined within the O-rings 13a and 13b when supplied. When extracted solvent is supplied, the bulging section 21 expands, whereupon the extracted solvent is reserved in the space of the bulging section 21. The portion of the film pack 20 corresponding to the space defined between the entrances 14a and 14b is also made to bulge such that a tube to be used for feeding and drawing solvent into and from the internal space defined between the O-rings 13a and 13b is readily inserted into the space defined between the entrances 14a and 14b.

The volume of the film pack 20 can be adjusted by means of controlling,the size of the bulging section 21, whereby the quantity of solvent to be fed into the film pack 20 can be readily determined. For instance, in a case where the quantity of solvent required for appropriately extracting contaminants is determined to be 30 ml, the solvent can spread over the entire surface of the wafer 15 without involvement of shortage or excess of solvent, by means of controlling the size of the bulging section 21. The film pack 20 can be formed by means of bulging or blowing.

[Inspection]

As shown in FIGS. 2A and 2B, a pair of wafer holding members 11a and 11b are brought to oppose each other while the wafer 15 to be inspected is sandwiched therebetween. The wafer holding member pair is fixedly clamped by use of a pair of fixing stoppers 23a and 23b. Extraction solvent (i.e., pure water) is supplied into the film pack by way of the entrances 14a and 14b. Subsequently, a cover 24 is placed on top of the pair of wafer holding members 11a and 11b, to thereby fix even the top of the wafer holding member pair and prevent leakage of extraction solvent from the top of the film pack.

In the present embodiment, the fixing stoppers 23a and 23b are provided on the respective sides of the wafer holding member pair. However, as shown in FIG. 2D, providing an additional stopper 23c at the bottom of the wafer holding member pair is effective for preventing leakage of extraction solvent from the bottom.

The measurement instrument is left in its present form in a thermostatic chamber, to thereby effect a hot-water extraction operation. As shown in FIG. 2C, after lapse of a predetermined period of time, the cover 24 is removed from the wafer holding member pair. The wafer holding members 11a and 11b are brought to oppose each other while care is taken to prevent mixing at the lower end of the wafer 15 a fluid extracted from the upper surface of the wafer and a fluid extracted from the underside of the wafer. The extracted fluids are accumulated in a lower portion of the film pack The extracted fluids accumulated in a lower portion of the film pack are drawn and fed to analysis means, by means of insertion of a tetrafluoroethylene tube by way of the entrances 14a and 14b.

[Measurement of Predetermined Portions]

Figure 3:
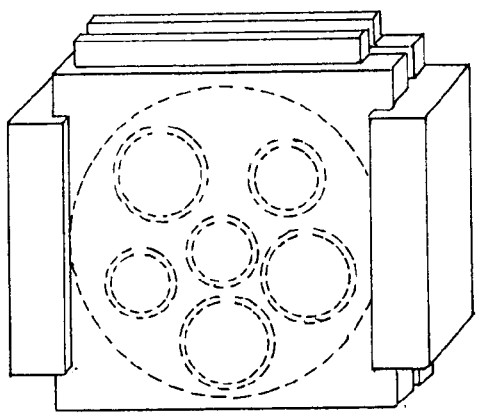
FIG. 3 is a schematic representation showing the instrument according to the present invention.
Figure 4A:
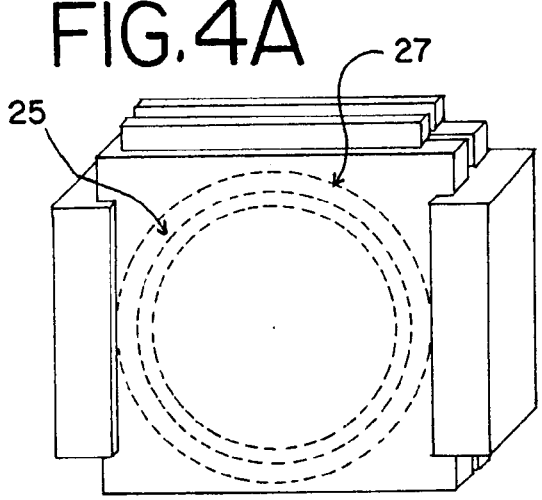
FIGS. 4A to 4D are schematic representations showing the instrument according to the present invention.
Figure 4B:
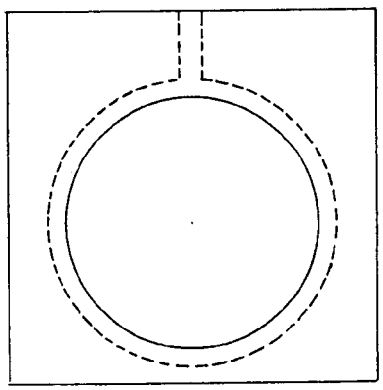
Figure 4C:
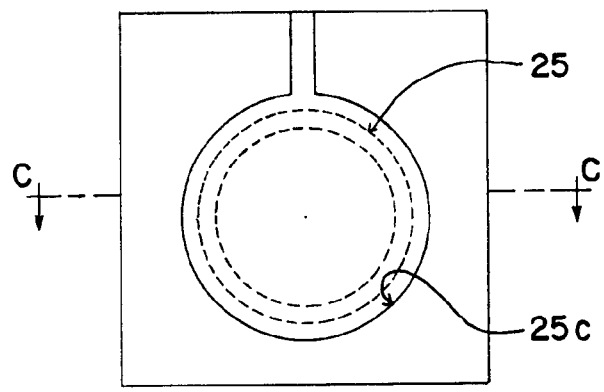
Figure 4D:
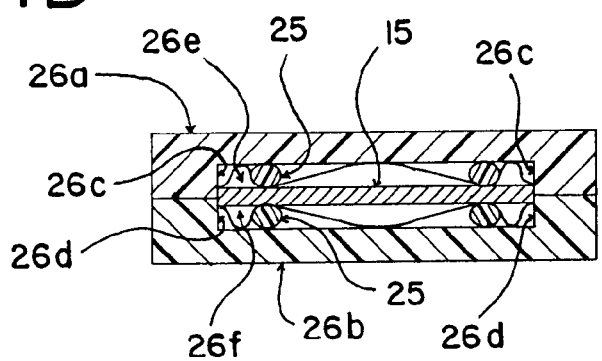

FIG. 3 through FIG. 4D are schematic representations for describing another embodiment of the instrument according to the present invention. FIG. 4D is a cross-sectional view taken along line C—C shown in FIG. 4C.

In the instrument for determining contamination of a wafer surface according to the present embodiment, the size of a projecting member and a location on a holding member at which the projecting member is to be placed can be arbitrary changed in accordance with an area on a wafer surface, which area is an object of inspection. As shown in FIG. 3, a plurality of projecting members may be provided on a single holding member.

In a case where wafer holding members having a plurality of projecting members formed thereon are brought to oppose each other, the plurality of projecting members come into contact with a wafer surface, wherewith a plurality of sealed spaces are defined within the areas enclosed by the respective projecting members. Extraction solvent can be supplied to and drawn from each of the sealed spaces independently, by means of inserting a tetrafluoroethylene tube into each of the spaces.

Even in a case where a plurality of predetermined places whose contamination must be measured are separately located on one surface of a wafer, contaminants can be extracted simultaneously from a plurality of areas.

In a case where an area desired to be excluded from objects of measurement is present on one surface of a wafer, the area is enclosed by a projecting member and extraction solvent is supplied to the space outside the thus-enclosed space, thereby enabling measurement of contamination of a required area.

In a case where a plurality of areas desired to be excluded from objects of measurement are present over one surface of a wafer, projecting members matched in size with the areas are provided in corresponding. positions on wafer holding members, thereby enclosing the areas. Extraction solvent is fed to the space outside the projecting members, thus enabling determination of contamination of a required area exclusive of the plurality of areas.

[Measurement at the Edge of a Wafer]

In a case where contamination of the edge of a wafer is desired to be measured, a wafer is held by the instrument shown in FIG. 1A. While the inside and outside of the O-rings 13a and 13b are kept in a sealed state, a tetrafluoroethylene tube is inserted into the space outside the O-rings 13a and 13b. Contaminants can be extracted from the surface of the edge of the wafer by means of merely feeding and drawing extraction solvent by way of the tube.

In still another embodiment in which an edge 27 of a wafer is measured, an O-ring 25 whose diameter is smaller than the outer diameter of a wafer to be inspected is provided on the respective wafer holding member, as shown in FIG. 4A. The O-ring 25 is equal to the O-ring 13 shown in FIG. 1A, provided that the cut of the O-ring 13 is removed (i.e., no entrance is formed in the O-ring). Accordingly, perfect elimination of a chance of water entering the inside of the O-rings by way of the entrances 14a and 14b can be accomplished. The outer diameter of the O-ring 25 is in proportion to the diameter of a wafer to be measured.

When a wafer held in a film pack is sandwiched between wafer holding members, the O-rings 25 come into contact with the wafer by way of the film pack. The interior space defined by the O-rings 25 is separated from the external space along the surface of the O-rings 25 being in contact with each other, wherewith the interior space is held in a sealed state.

Extraction solvent is supplied to the exterior outside of the space defined by the O-rings 25 and is reserved in the space outside the O-rings 25 without involvement of leakage of extraction solvent into the interior space of the O-rings 25. As a result, contaminants can be extracted from solely the edge of the wafer to be measured.

As shown in FIG. 4B, in the present embodiment, a portion of the film pack is sealed along the outer periphery of the wafer, and the volume of the space defined outside the O-rings 25 is determined by the seal. Accordingly, the amount of extraction solvent required to fill the space can be suppressed to a small amount. Preferably, a high-concentration extracted fluid and highly-reliable data can be obtained.

As shown in FIGS. 4C and 4D, in a case where contaminants are extracted from the surface of the edge of the wafer according to the present invention, a recess is formed in each of the surfaces of holding members 26a and 26b, which surfaces are disposed opposite a wafer. An interior wall 26c formed in the recess of the holding member 26a and an interior wall 26d formed in the recess of the holding member 26b are brought into contact with the outer edge of the wafer 15. A space is defined by the O-ring 25, the holding member 26a, and the wafer 15, and another space is defined by the O-ring 25, the holding member 26b, and the wafer 15. Thereby, a sealed space 26e is formed between the O-ring 25 provided on the holding member 26a and the edge of the wafer 15, and a sealed space 26f is formed between the O-ring 25 provided on the holding member 26b and the edge of the wafer 15.

So long as extraction solvent is supplied to the sealed spaces 26e and 26f independently, the extraction solvent supplied to the upper surface of the wafer 15 is prevented from being mixed with the extraction solvent supplied to the underside of the wafer 15. Consequently, extraction of contaminants from the edge of the upper surface of the wafer separate from extraction of contaminants from the edge of the underside of the wafer becomes feasible.

As a result of such a method of extracting contaminants, contamination of the edge of the upper surface of a wafer and contamination of the edge of the underside of the wafer can be determined separately from each other. Further, extraction of contaminants from the edge of the upper surface of a wafer and extraction of contaminants from the edge of the wafer can be carried out simultaneously. Thus, the instrument according to the present invention enables separate and simultaneous determination of contamination of an upper surface of a wafer and contamination of an underside of the wafer.

[Use of Magnets Serving as a Sealing Members]

Figure 5A:
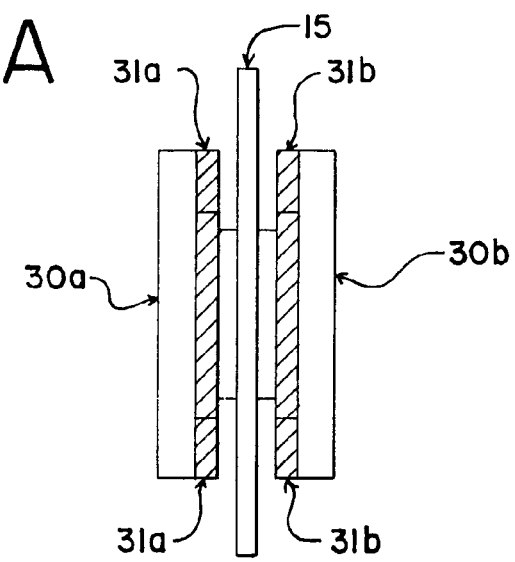
FIGS. 5A and 5B are schematic representations showing the instrument according to the present invention.
Figure 5B:
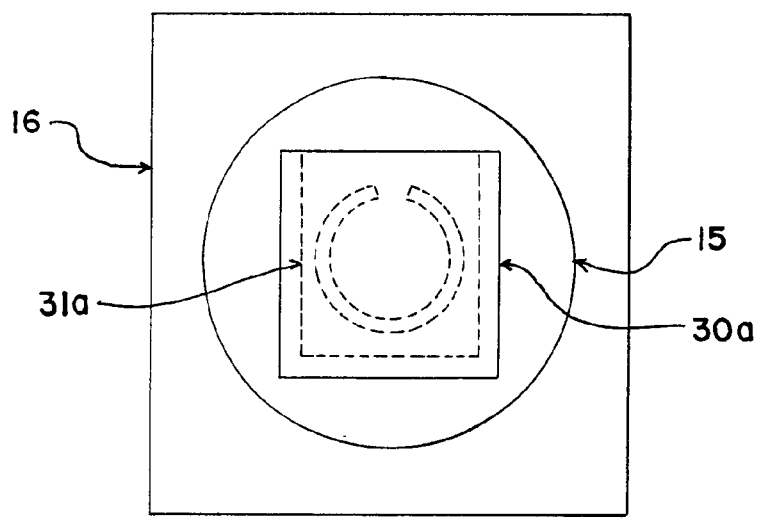

FIGS. 5A and 5B are schematic representations for describing a case where magnets are used as sealing members of the instrument according to the present invention.

As shown in FIG. 5A, in the instrument according to the present embodiment, a magnet 31a is provided on a holding member 30a so as to serve as a sealing member. On a holding member 30b provided opposite the holding member 30a, there is provided a magnet 31b whose polarity is opposite that of the magnet 31a.

As shown in FIG. 5B, in a case where paired holding members 30a and 30b are brought to oppose each other by way of the wafer 15 held in the film pack 16, the holding members 30a and 30b (not shown) are brought to oppose each other by way of the wafer 15, by means of magnetic attraction forces of the magnets 31a and 31b.

Even in a case where contamination of the surface of a large-diameter wafer is to be determined, the instrument of such a structure enables extraction of contaminants without involvement of changing the size of holding members in accordance with the diameter of the wafer. A plurality of wafers of different sizes can be measured through use of a single instrument.

[UV Radiation]

Figure 6:
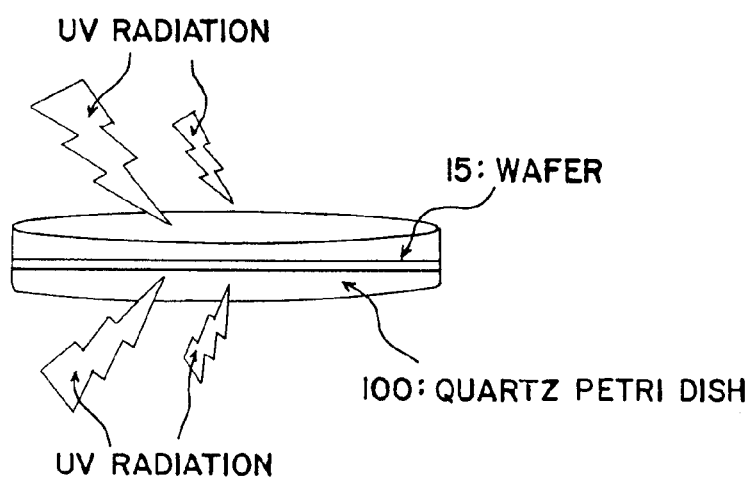
FIG. 6 is a schematic representation showing an embodiment in which a wafer is exposed to UV radiation.

As shown in FIG. 6, the wafer 15 to be inspected is placed in a quartz Petri dish 100 and is exposed to UV radiation, to thereby dissociate inorganic components from organic components (as expressed by the following formulas).

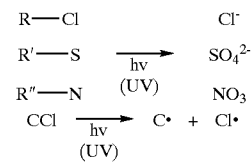

In the present embodiment, in order to simultaneously expose respective sides of the wafer 15, which is an object of inspection kept in the quartz Petri dish 100, UV rays are radiated onto the wafer 15 simultaneously from the top and bottom. As is obvious to one skilled in the art, modifications may be made to the embodiment, such as exposure of one side of the wafer 15 at one time, in accordance with restrictions which would be imposed when the present invention is carried out. Such modifications to the invention can be made freely.

UV rays having a wavelength of 300 nm or less (for example, UV rays having a wavelength of 184.9 nm or 253.7 nm) are usually employed. The wavelength and intensity of UV rays are determined on the basis of bond energy of atoms desired to be dissociated, in consideration of the equation E=hν (E denotes energy; "h" denotes Planck's constant, and "ν denotes the oscillation frequency [reciprocal of wavelength (ν=1/λ)] or the quantity of contaminants. As an example, the wavelength of UV rays can be determined by reference to an absorption spectrum such as that provided in Table 1.

By way of example, the intensity of UV rays can be determined by reference to values provided in Table 2. Particularly, in a case where compounds constituting contaminants are intended to be uniformly decomposed (the reaction expressed by the lower chemical formula), data provided in Table 2 are to be referred to. In contrast, when compounds are intended to be unevenly decomposed (the reaction expressed by the upper chemical formula), data provided in Table 3 are to be referred to.

TABLE 1

ABSORPTIVITY OF ISOLATED CHROMOPHORIC GROUP

| CHROMOPHORIC GROUP | EXAMPLE | $\lambda_{max}[m\mu]$ | $\epsilon_{max}$ | SOLVENT |
|---|---|---|---|---|
| >C=C< | ETHYLENE | 171 | 15530 | GAS |
|  | 1-OCTENE | 177 | 12600 | HEPTANE |
| —C≡C— | 2-OCTYNE | 178 | 10000 | HEPTANE |
|  |  | 196 | ABOUT 2100 | HEPTANE |
|  |  | 223 | 160 | HEPTANE |
| —C=O | ACETALDEHYDE | 168 | 20000 | GAS |
|  |  | 180 | 10000 | GAS |
|  |  | 290 | 17 | HEXANE |
| C=O | ACETONE | 166 | 16000 | GAS |
|  |  | 189 | 900 | HEXANE |
|  |  | 279 | 15 | HEXANE |
| —CO$_2$H | ACETIC ACID | 208 | 32 | ETHANOL |
| —COCl | ACETYL CHLORIDE | 220 | 100 | HEXANE |
| —CONH$_2$ | ACETAMIDE | 178 | 9500 | HEXANE |
|  |  | 228 | 63 | WATER |
| —CO$_2$R | ETHYL ACETATE | 211 | 57 | ETHANOL |
| —NO$_2$ | NITROMETHANE | 201 | 5000 | METHANOL |
|  |  | 274 | 17 | METHANOL |
| —ONO$_2$ | BUTYL NITRATE | 270 | 17 | ETHANOL |
| —ONO | BUTYL NITRITE | 220 | 14500 | HEXANE |
|  |  | 356 | 87 | HEXANE |
| —NO | NITROSOBUTANE | 300 | 100 | ETHER |
|  |  | 665 | 20 | ETHER |
| >C—N | NEOPENTYLIDEN | 235 | 100 | ETHANOL |
| —C≡N | n-BUTYLAMINE |  |  |  |
| —N$_3$ | ACETONITRILE | 167 | WEAK | GAS |
|  | AZIDEETHYL ACETATE | 285 | 20 | ETHANOL |
| =N$_2$ | DIAZOMETHANE | ABOUT 410 | 3 | GAS |
|  | DIAZOETHYL ACETATE | 249 | 10050 | ETHANOL |
|  |  | 378 | 16 | ETHANOL |
| —N=N— | AZOMETHANE | 338 | 4 | ETHANOL |

TABLE 2

UNIFORM BOND/DISSOCIATION ENERGY (kcal/mol)
A:B → A·+·B  ΔH = UNIFORM BOND/DISSOCIATION ENERGY, D (A - B)

| H—H | 104 |  |  |  |  | CH$_3$—H | 104 |  |
|---|---|---|---|---|---|---|---|---|
| H—F | 136 | F—F | 38 |  |  | CH$_3$—F | 108 |  |
| H—Cl | 103 | Cl—Cl | 58 |  |  | CH$_3$—Cl | 84 |  |
| H—Br | 88 | Br—Br | 46 |  |  | CH$_3$—Br | 70 |  |
| H—I | 71 | I—I | 36 |  |  | CH$_3$—I | 56 |  |
| CH$_3$—H | 104 | CH$_3$—CH$_3$ | 88 | CH$_3$—Cl | 84 | CH$_3$—Br | 70 |  |
| C$_2$H$_5$—H | 98 | C$_2$H$_5$—CH$_3$ | 85 | C$_2$H$_5$—Cl | 81 | C$_2$H$_5$—Br | 69 |  |
| n-C$_3$H$_7$—H | 98 | n-C$_3$H$_7$—CH$_3$ | 85 | n-C$_3$H$_7$—Cl | 82 | n-C$_3$H$_7$—Br | 69 |  |
| i-C$_3$H$_7$—H | 95 | i-C$_3$H$_7$—CH$_3$ | 84 | i-C$_3$H$_7$—Cl | 81 | i-C$_3$H$_7$—Br | 68 |  |
| i-C$_4$H$_9$—H | 92 | i-C$_4$H$_9$—CH$_3$ | 80 | i-C$_4$H$_9$—Cl | 79 | i-C$_4$H$_9$—Br | 63 |  |
| H$_2$C=CH—H | 108 | H$_2$C=CH—CH$_3$ | 92 | H$_2$C=CH—Cl | 84 |  |  |  |
| H$_2$C=CHCH$_2$—H | 88 | H$_2$C=CHCH$_2$—CH$_3$ | 72 | H$_2$C=CHCH$_2$—Cl | 60 | H$_2$C=CHCH$_2$—Br | 47 |  |
| C$_6$H$_5$—H | 110 | C$_6$H$_5$—CH$_3$ | 93 | C$_6$H$_5$—Cl | 86 | C$_6$H$_5$—Br | 72 |  |
| C$_6$H$_5$CH$_2$—H | 85 | C$_6$H$_5$CH$_2$—CH$_3$ | 70 | C$_6$H$_5$CH$_2$—Cl | 68 | C$_6$H$_5$CH$_2$—Br | 51 |  |

TABLE 3

NONUNIFORM BOND/DISSOCIATION ENERGY (kcal/mol)
A:B → A$^+$+:B$^+$  ΔH = NONUNIFORM BOND/DISSOCIATION ENERGY, D (A$^+$ − B$^+$)

|  |  |  |  |  |  |  |  |
|---|---|---|---|---|---|---|---|
|  | H—H | 401 |  |  | CH$_3$—H | 313 |  |
|  | H—F | 370 |  |  | CH$_3$—F | 256 |  |
|  | H—Cl | 334 |  |  | CH$_3$—Cl | 227 |  |
|  | H—Br | 324 |  |  | CH$_3$—Br | 219 |  |
|  | H—I | 315 |  |  | CH$_3$—I | 212 |  |
|  | H—OH | 390 |  |  | CH$_3$—OH | 274 |  |
| CH$_3$—Cl | 227 | CH$_3$—Br | 219 | CH$_3$—I | 212 | CH$_3$—OH | 274 |
| C$_2$H$_5$—Cl | 191 | C$_2$H$_5$—Br | 184 | C$_2$H$_5$—I | 176 | C$_2$H$_5$—OH | 242 |
| n-C$_3$H$_7$—Cl | 185 | n-C$_3$H$_7$—Br | 178 | n-C$_3$H$_7$—I | 171 | n-C$_3$H$_7$—OH | 235 |
| i-C$_3$H$_7$Cl | 170 | i-C$_3$H$_7$—Br | 164 | i-C$_3$H$_7$—I | 156 | i-C$_3$H$_7$—OH | 222 |
| i-C$_4$H$_9$—Cl | 157 | i-C$_4$H$_9$—Br | 149 | i-C$_4$H$_9$—I | 140 | i-C$_4$H$_9$—OH | 208 |
| H$_2$C=CH—Cl | 207 | H$_2$C=CH—Br | 200 | H$_2$C=CH—I | 194 |  |  |
| H$_2$C=CHCH$_2$—Cl | 173 | H$_2$C=CHCH$_2$Br | 165 | H$_2$C=CHCH$_2$—I | 159 | H$_2$C=CHCH$_2$—OH | 223 |
| C$_6$H$_5$—Cl | 219 | C$_6$H$_5$—Br | 210 | C$_6$H$_5$—I | 202 | C$_6$H$_5$—OH | 275 |
| C$_6$H$_5$CH$_2$—Cl | 166 | C$_6$H$_5$CH$_2$—Br | 157 | C$_6$H$_5$CH$_2$—I | 149 | C$_6$H$_5$CH$_2$—OH | 215 |

Basically, in the present embodiment, a wafer is exposed to UV radiation before being incorporated into the instrument. After having been subjected to measurement, a wafer may be exposed and subjected to extraction and measurement, as required.

Use of the instrument according to the present invention enables extraction of contaminants from the upper surface of a wafer separately from extraction of contaminants from the underside of the wafer, by means of a simple operation. Further, contaminants can be extracted simultaneously from the upper surface and underside of a wafer. Negative ions (F$^−$, Cl$^−$, or others) and positive ions (Na$^+$, K$^+$, or others) may be measured simultaneously.

Further, the instrument of the present invention enables extraction of contaminants from and measurement of contaminants located on arbitrarily-limited areas on a wafer. Even if a plurality of areas desired to be measured are spread over the surface of a wafer, the respective areas can be measured simultaneously. Improper distribution of contaminants on a wafer surface can be promptly measured.

This technique of measuring a plurality of areas simultaneously enables early measurement of contaminants on a wafer surface even when each side of the wafer is measured. Feedback of measurement results required for adjusting processes of cleaning a semiconductor device can be carried out early. By means of such an early adjustment, contamination of a wafer, which would otherwise be caused during a preprocessing operation, can be diminished. In addition, since the source and cause of contamination can be specified readily and quickly, contamination can be immediately addressed, thus improving the efficiency of the overall semiconductor manufacturing processes.

Further, the instrument according to the present invention can make the structure of the instrument simple, and holding members having protuberances of different shapes or sizes can be readily manufactured. Even in a case where wafers needing measurement have different sizes, contaminants on the surface of each of the wafers can be readily measured.

A wafer to be inspected is exposed to UV radiation, thereby enabling measurement of contaminants, such as inorganic substances, without fail.

What is claimed is:

1. An instrument to be used for extracting contaminants from a wafer surface to inspected, comprising:
a pair of wafer holding members capable of holding the wafer while the wafer is held in an impermeable bag; and
a fixing member for securing the wafer holding member pair in an opposite state, wherein
a surrounding member for enclosing a portion to be inspected of the wafer surface is provided on the surface of at least one of the wafer holding members, the surface being faced with the wafer.

2. The instrument as defined in claim 1, wherein a support member for supporting the lower edge of the wafer to be inspected is provided on a lower portion of at least one of the wafer holding members, to thereby position the wafer.

3. The instrument as defined in claim 2, wherein the surrounding member is a cord-like member.

4. The instrument as defined in claim 3, wherein the surrounding member is a curved protruding member having a predetermined entrance.

5. The instrument as defined in claim 4, wherein the curve of the curved protruding member assumes a circular geometry.

6. An instrument set for measuring contamination of a wafer, comprising:
an instrument to be used for extracting contaminants from a wafer surface to be inspected, the instrument including a pair of wafer holding,members capable of holding the wafer while the wafer is held in an impermeable bag, a fixing member for securing the wafer holding member pair in an opposing state, and a surrounding member provided on the surface of at least one of the wafer holding members for enclosing a certain portion of the wafer surface, the surface being brought into contact with the wafer; and
an impermeable bag for holding the wafer, wherein the wafer held in the bag is held from respective sides thereof.

7. The impermeable bag as defined in claim 6, wherein a portion of the impermeable bag to be enclosed by the curved protruding member and a portion of the same corresponding to the predetermined entrances bulge particularly.

8. The instrument as defined in claim 6, wherein a support ember for supporting the lower edge of the wafer to be inspected is provided on a lower portion of at least one of the wafer holding members, to thereby position the wafer.

9. The instrument as defined in claim 8, wherein the surrounding member is a cord-like member.

10. The instrument as defined in claim 9, wherein the surrounding member is a curved protruding member having a predetermined entrance.

11. The instrument as defined in claim 10, wherein the curve of the curved protruding member assumes a circular geometry.

12. A method of measuring, through extraction, contaminants adhering to a wafer surface to be inspected, the method comprising the steps of:

setting the wafer in an impermeable bag;

enclosing a certain area on the upper surface of a wafer to be inspected independently of another certain area on the underside of the wafer; and feeding and drawing extraction solvent to and from each of the enclosed areas independently, to thereby enable simultaneous and independent measurement of contaminants on the upper surface and underside of the wafer.

13. A method of manufacturing a semiconductor device, utilizing an inspection step in which extraction of contaminants adhering to the upper surface of a wafer, the wafer being an object of inspection and held in an impermeable bag, and extraction of contaminants adhering to the underside of the wafer are carried out simultaneously and independently.

14. A method of measuring contaminants adhering to a wafer surface through extraction, the method comprising the steps of:

holding a wafer to be inspected in an impermeable bag;

enclosing a certain area on the surface of the wafer; and feeding and drawing extraction solvent to and from the inside or outside of the enclosed area, to thereby measure improper distribution of contaminants on the wafer surface.

15. A method of manufacturing a semiconductor device, utilizing an inspection step in which contaminants are extracted from a certain area on the surface of a wafer, the wafer being an object of inspection and held in an impermeable bag, to thereby enable determination of contaminants in a certain range of the wafer surface.

16. The instrument as defined in claim 1, wherein the pair of holding members are identical in shape, each assuming a rectangular parallelepiped geometry; the fixing members are preferably clamping members for clamping the pair of holding members in a paired manner; and the clamping members fix three sides of the rectangular-parallelepiped holding member pair.

17. The instrument as defined in claim 16, wherein the clamping members are fitted around the paired rectangular-parallelepiped holding members in a sliding manner, and a groove for guiding a slide member of the clamping members is formed in each of the paired rectangular-parallelepiped holding members.

18. The instrument as defined in claim 1, wherein the fixing members are formed from a pair of magnets which are respectively provided on the paired holding members and attract each other, and the paired holding members are fixed on the surface of the wafer under the attraction force of the magnets.

19. The method as defined in claim 12, further comprising a step of exposing the surface of the wafer to UV radiation.

20. The instrument set s defined in claim 6, wherein use of a quartz Petri dish for holding the wafer is included.

21. The instrument as defined in claim 1, wherein a wafer having been exposed to UV radiation is employed as a wafer to be inspected.

22. The instrument as defined in claim 16, wherein a wafer having been exposed to UV radiation is employed as a wafer to be inspected.

23. A method of measuring contaminants by extraction of contaminants adhering to the surface of a wafer to be inspected, the method including:

a step of irradiating the wafer with ultraviolet radiation having a wavelength capable of dissociating inorganic components from organic components adhering to the surface of the wafer, to thereby dissociate the inorganic components from the surface of the wafer and a step extracting and measuring the dissociated inorganic components.

* * * * *